(12) United States Patent
Chang et al.

(10) Patent No.: US 6,346,467 B1
(45) Date of Patent: Feb. 12, 2002

(54) METHOD OF MAKING TUNGSTEN GATE MOS TRANSISTOR AND MEMORY CELL BY ENCAPSULATING

(75) Inventors: Chi Chang, Redwood City; Richard J. Huang, Cupertino, both of CA (US); Keizaburo Yoshie, Nagoya (JP); Yu Sun, Saratoga, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/649,027

(22) Filed: Aug. 28, 2000

Related U.S. Application Data
(60) Provisional application No. 60/152,126, filed on Sep. 2, 1999.

(51) Int. Cl.[7] .................................. H01L 21/3205
(52) U.S. Cl. .................. 438/594; 438/264; 438/595
(58) Field of Search ............................ 438/261, 264, 438/592, 593, 594, 595, 653, 656

(56) References Cited

U.S. PATENT DOCUMENTS

| | | | |
|---|---|---|---|
| 5,077,691 A | 12/1991 | Haddad et al. | 365/200 |
| 5,470,773 A | 11/1995 | Liu et al. | 438/264 |
| 5,600,177 A | 2/1997 | Yamazaki | 257/588 |
| 5,789,294 A | 8/1998 | Choi | 438/258 |
| 5,925,918 A | * 7/1999 | Wu et al. | 438/595 |
| 6,020,111 A | * 2/2000 | Mihara | 438/594 |
| 6,107,171 A | * 8/2000 | Tsai | 438/595 |

FOREIGN PATENT DOCUMENTS

| | | |
|---|---|---|
| EP | 0706206 A2 | 4/1996 |
| EP | 0706206 A3 | 8/1996 |
| EP | 0997930 A1 | 5/2000 |

OTHER PUBLICATIONS

"Integration Technorology of Polymetal (W/WSiN/Poly–Si) Dual Gate CMOS for 1Gbit DRAMs and Beyond", Y. Hiura et al., IEDM Technical Digest, 1998, pp. 389–392.

* cited by examiner

*Primary Examiner*—Chandra Chaudhari

(57) ABSTRACT

A tungsten gate MOS transistor and a memory cell useful in flash EEPROM devices are fabricated by encapsulating the tungsten gate electrode contact of each of the MOS transistor and floating gate memory cell by silicon nitride capping and sidewall layers. The inventive methodology advantageously prevents deleterious oxidation during subsequent processing at high temperature and in an oxidizing ambient.

17 Claims, 2 Drawing Sheets

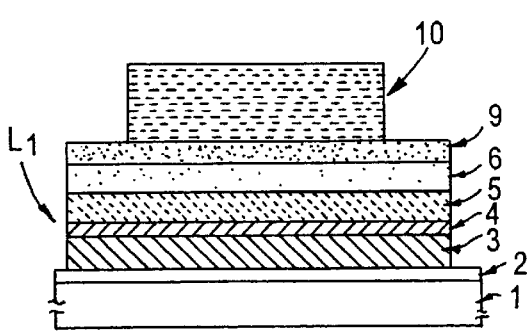
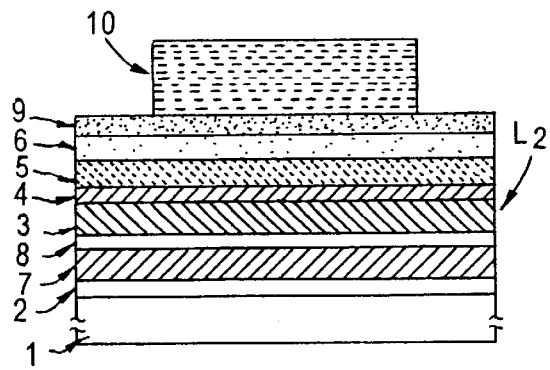
FIG. 1(a)     FIG. 2(a)
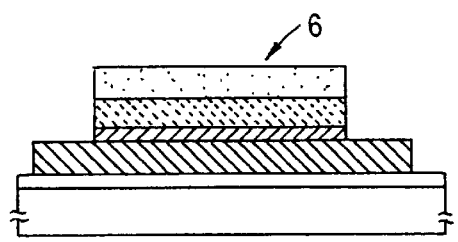
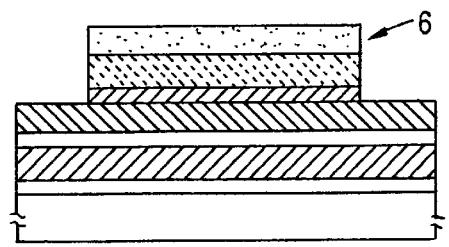
FIG. 1(b)     FIG. 2(b)
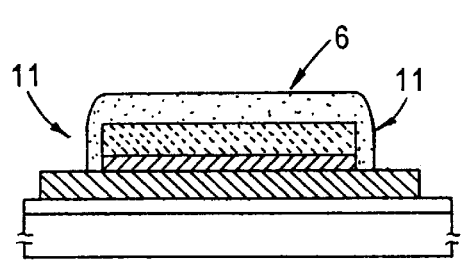
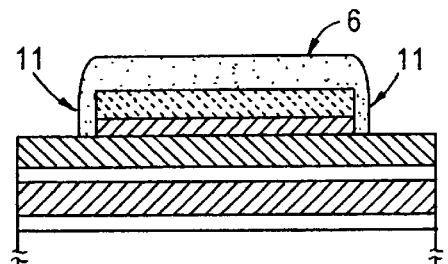
FIG. 1(c)     FIG. 2(c)
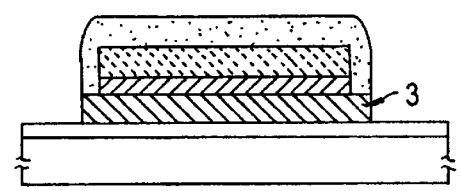
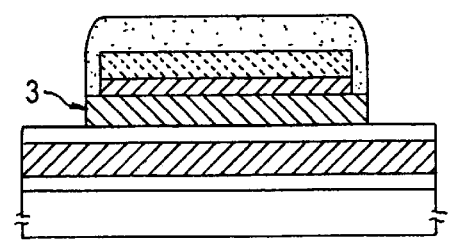
FIG. 1(d)     FIG. 2(d)

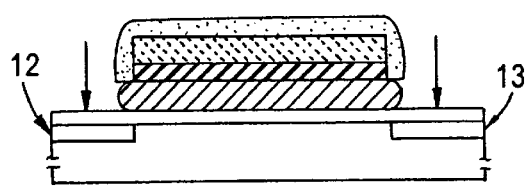
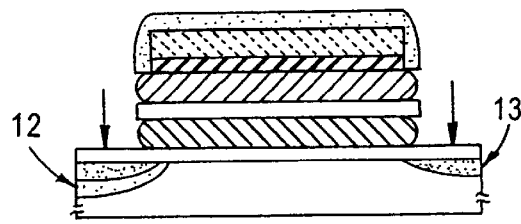
FIG. 1(e)  FIG. 2(e)
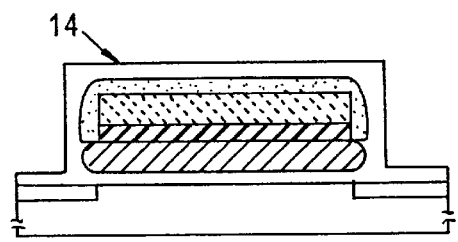
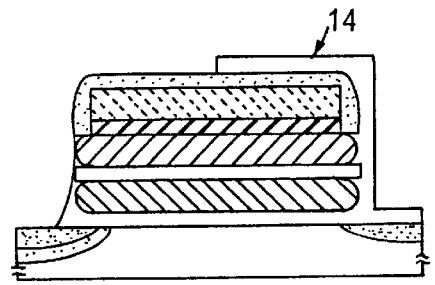
FIG. 1(f)  FIG. 2(f)
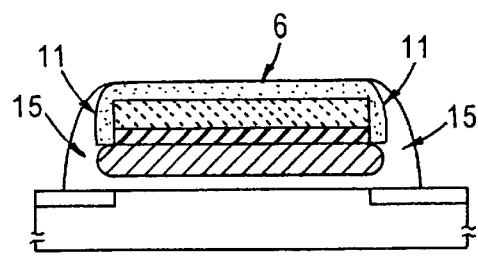
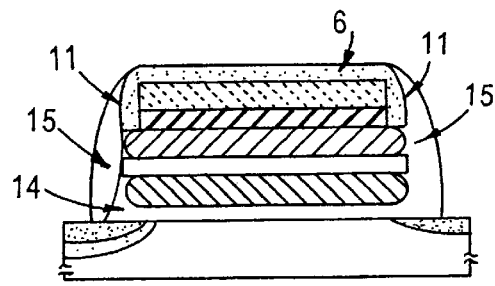
FIG. 1(g)  FIG. 2(g)
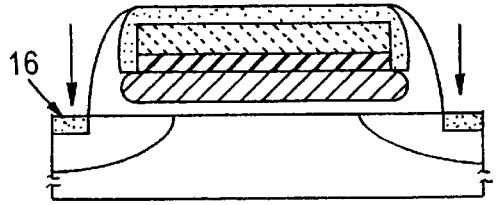
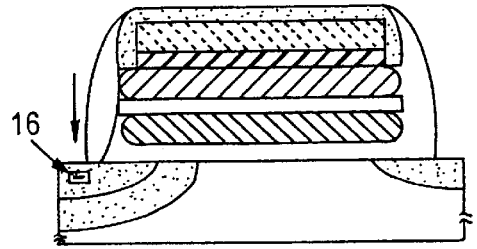
FIG. 1(h)  FIG. 2(h)

METHOD OF MAKING TUNGSTEN GATE MOS TRANSISTOR AND MEMORY CELL BY ENCAPSULATING

CROSS-REFERENCE TO PROVISIONAL APPLICATION

This application claims priority from provisional patent application Ser. No. 60/152,126, filed Sep. 2. 1999, the entire disclosure of which is incorporated herein by reference.

FIELD OF THE INVENTION

The present invention relates to a method of manufacturing a MOS transistor and a memory cell on a common semiconductor substrate and the device obtained thereby. The present invention has particular utility in manufacturing high-density integration semiconductor memory devices, such as flash electrically erasable programmable read only memories (flash EEPROMS), with design rules of about 0.18 micron and under.

BACKGROUND OF THE INVENTION

The flash EEPROM is so named because the contents of all of the memory's array cells can be erased simultaneously at high speed. Flash EEPROMs, unlike floating gate EEPROMs which include a separate select transistor in each cell to provide for individual byte erasure, eliminate the select transistor and provide bulk erasure. As a consequence, flash EEPROM cells can be made much smaller than floating gate EEPROM cells fabricated under the same design rules, thus permitting formation of high density memories having easy erasability and reprogrammability.

Conventional flash EEPROMs typically comprise a floating gate memory cell, which includes a source region, a drain region, and a channel region formed in a semiconductor substrate, usually a silicon wafer, and a floating gate formed above the substrate and located between the channel region and a control gate. Most flash EEPROM cells use a "double-poly" structure, wherein an upper layer formed of e.g., polysilicon and termed "poly 2", forms the control gate and a lower layer of polysilicon, termed "poly 1", forms the floating gate. The gate oxide layer is typically about 10 nm thick and the interpoly dielectric typically comprises a three layer composite of silicon oxide/silicon nitride/silicon oxide layers ("ONO") of total thickness of about 25 nm or less.

In operation, to program the memory cell, typically by Channel Hot Electron ("CHE") injection, a high voltage, such as about 10 volts, is applied to the control gate and a moderately high voltage, e.g. about 5 volts, is applied to the drain terminal while the source and substrate terminals are at ground potential. To erase the cell, either a Source Edge Erase ("SEE") or a Channel Erase ("CE") procedure can be utilized. According to the SEE procedure, a high negative voltage, such as –10 volts, is applied to the control gate and a moderately high voltage, e.g., about 5 volts, is applied to the source terminal while the drain potential floats. According to the CE procedure, a high negative voltage, such as –10 volts, is applied to the control gate and a moderately high voltage, e.g., about 7 volts, is applied to the device body (e.g., a well) while the source and drain potentials float. In either instance, a sufficiently large electric field is developed across the tunnel oxide and electrons can tunnel out from the floating gate either at the source terminal (SEE procedure) or through the channel region (CE procedure).

Flash EEPROM systems conventionally comprise a two-dimensional array of floating gate memory cells such as described above. The array typically includes several strings of floating gate memory transistors, each transistor being coupled to the neighboring transistor in the string by coupling the source of one device to the drain of the neighboring device, thereby forming bit lines. A plurality of word lines, perpendicular to the strings, each connect to the control gate of one memory cell of each string.

A CMOS transistor, referred to as a "row selector", is employed at one end of each word line to supply program voltage on demand to each of the word lines. The row selecting transistor and other transistors, e.g., for power supply purposes, are formed in the semiconductor wafer substrate concurrent with the formation of the memory cell array and typically employ much of the same processing steps and conditions. In some instances, the transistor, termed a "poly 2 periphery transistor" is formed on a peripheral portion of the semiconductor substrate and utilizes the "poly 2", or upper polysilicon layer used to form the control gates of the memory array cells.

In order to electrically contact the "poly 2" layer forming the gate electrode of such peripheral transistors and the control gate electrode of the memory array cells, a layer of a refractory metal, e.g., titanium (Ti) or tungsten (W), is typically formed over the "poly 2" electrode (with or without interposition of adhesion and/or barrier layer(s)) and suitably patterned and annealed. The use of tungsten for forming such contacts is particularly attractive because tungsten-based polysilicon gate electrode contacts can be formed with sub-micron sized dimensions (D. Hisamoto et al., 1995 Symposium on VLSI Technology Digest of Technical Papers, pp 115–116), and with very low sheet resistance (i.e., 1.6–3$\Omega$/□) when either a titanium nitride (TiN) or tungsten nitride ($WN_x$) interlayer is provided between the tungsten layer and the polysilicon gate electrode layer (D. H. Lee et al., 1995 Symposium on VLSI Technology Digest of Technical Papers, pp 119–120; K. Kasai et al., IEDM 94, pp 497–500). However, a significant problem encountered with the use of tungsten as a gate electrode contact metal in memory array manufacture is oxidation thereof during high temperature (e.g., about 900° C.) furnace processing under an oxidizing ambient during MOS transistor and flash memory cell fabrication.

Thus, there exists a need for a process scheme, compatible with existing flash memory semiconductor manufacture, which allows formation of very low sheet resistance tungsten gate electrode contacts of deep submicron dimensions while reducing or eliminating oxidation thereof during subsequent processing.

DISCLOSURE OF THE INVENTION

An advantage of the present invention is a method of manufacturing a high-density flash memory array with an improved control gate electrode contact structure.

Another advantage of the present invention is a method of manufacturing a flash memory array including a control gate electrode structure which is resistant to oxidation during high temperature processing in an oxidizing ambient.

Still another advantage of the present invention is a method of simultaneously forming oxidation resistant tungsten-based contacts to the gate electrode of a MOS transistor and the control gate electrode of a memory cell of a flash EEPROM.

A still further advantage of the present invention is provision of a high density integration flash EEPROM semiconductor device having a tungsten-based gate electrode contact structure resistant to oxidation.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

providing a semiconductor substrate comprising silicon and having a surface;

sequentially forming over the substrate a layer stack comprising:
a gate oxide layer (a) on the substrate surface,
an electrically conductive polysilicon layer (b) on the gate oxide layer,
a barrier material layer (c) on the polysilicon layer,
a tungsten layer (d) on the barrier material layer, and
a silicon nitride layer (e) on the tungsten layer;

selectively removing portions of layers (c)–(e) to define a pattern therein exposing sidewall surfaces of layers (c)–(e);

selectively forming a silicon nitride layer (f) covering the exposed sidewall surfaces of layers (c)–(c), whereby the tungsten layer (d) is encapsulated by the combination of silicon nitride layers (e) and (f) formed on the uppermost and sidewall surfaces thereof, respectively;

selectively removing portions of polysilicon layer (b) to define a pattern therein exposing sidewall surfaces thereof in substantial vertical registry with the sidewall surfaces of layers (c)–(e); and annealing the thus-formed layer stack at an elevated temperature in an oxidizing ambient, whereby the silicon nitride encapsulating layers (e) and (f) prevent oxidation of the tungsten layer (d) during the annealing.

According to another aspect of the present invention, the semiconductor device comprises a transistor, the layer stack forming comprises forming same on at least a peripheral portion of the substrate surface, the electrically conductive polysilicon layer (b) comprises a gate electrode of the transistor, and the tungsten layer (d) comprises a gate electrode contact.

According to still another aspect of the present invention, the method further comprises, after forming gate oxide layer (a) but prior to forming polysilicon layer (b), the steps of:

forming an electrically conductive polysilicon layer (a') on the gate oxide layer (a); and forming an interpoly dielectric layer (a") on the polysilicon layer (a');

the method further comprising the step of selectively removing portions of polysilicon layer (a') and interpoly dielectric layer (a") to thereby expose sidewall surfaces thereof in substantial vertical registry with the exposed sidewall surfaces of layers (b)–(e);

wherein the semiconductor device comprises a flash EEPROM, polysilicon layer (a') comprises a floating gate electrode, polysilicon electrode (b) comprises a control gate electrode, and tungsten layer (d) comprises a low sheet resistance control gate electrode contact.

In embodiments according to the present invention, polysilicon layer (b) corresponds to "poly 2", polysilicon layer (a') corresponds to "poly 1", the barrier material layer (c) comprises titanium nitride or tungsten nitride, the interpoly dielectric layer (a") comprises a silicon oxide/silicon nitride/silicon oxide ("ONO") composite, and the annealing comprises heating in a furnace in an oxygen containing ambient at a temperature of from about 800° C. to about 950° C. for from about 30 min. to about 60 min.

According to a still further aspect of the present invention, a semiconductor device structure comprises:

a semiconductor substrate comprising silicon and having a surface with at least one active device region formed therein or thereon;

a layer stack formed on the substrate surface over the at least one active device region, the layer stack comprising, in sequence:
a gate oxide layer (a) on the substrate,
an electrically conductive polysilicon gate electrode layer (b) on the gate oxide layer,
a titanium nitride or tungsten nitride barrier layer (c) on the polysilicon layer,
a tungsten gate electrode contact layer (d) on the barrier layer, and
a silicon nitride layer (e) on the tungsten layer, the layer stack patterned to expose
sidewall surfaces of layers (b)–(e); and a silicon nitride layer (f) covering the exposed sidewall surfaces of layers (c)–(e), whereby the tungsten layer (d) is encapsulated by the combination of silicon nitride layers (e) and (f) formed on the uppermost and sidewall surfaces thereof, respectively, thereby preventing oxidation of tungsten layer (d) during annealing treatment of the device structure at an elevated temperature in an oxidizing ambient.

According to an aspect of the present invention, the semiconductor device structure comprises a transistor and the at least one active device region is formed at least at a peripheral portion of the semiconductor substrate.

According to a further aspect of the present invention, the layer stack of the semiconductor device structure further comprises an electrically conductive polysilicon layer (a') (="poly 1") on the gate oxide layer (a) and a silicon oxide/silicon nitride/silicon oxide composite interpoly dielectric layer (a") on the polysilicon layer (a') and under polysilicon layer (b) (="poly 2"), polysilicon layer (a') and composite interpoly dielectric layer (a") patterned to expose sidewall surfaces thereof in substantial vertical registry with the sidewall surfaces of layers (b)–(e) of the layer stack, wherein the semiconductor device structure comprises a flash-type EEPROM, polysilicon layer (a') comprises a floating gate electrode, polysilicon layer (b) comprises a control gate electrode, and tungsten layer (d) comprises a control gate electrode contact.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be realized the present invention is capable of other and different embodiments, and its several details are capable of modifications in various obvious respects, all without departing from the present invention. Accordingly, the drawing and description are to be regarded as illustrative in nature, and not as limitative.

BRIEF DESCRIPTION OF THE DRAWINGS

FIGS. 1(a)–1(h) and 2(a)–(h) are simplified, cross-sectional schematic diagrams illustrating process steps for forming "poly 2" peripheral transistor and stacked-gate memory cell portions, respectively, of a flash-type EEPROM device, in accordance with an embodiment of the present invention.

It should be recognized that the various layers forming the layer stack or laminate illustrated in the appended drawing figures as representing portions of EEPROM structures and devices fabricated according to the inventive methodology are not drawn to scale, but instead are drawn as to best illustrate the features of the present invention.

DESCRIPTION OF THE INVENTION

Referring to FIGS. 1(a) and 2(a), shown therein are layer stacks $L_1$ and $L_2$ formed on peripheral and central portions, respectively, of the silicon-based semiconductor substrate 1. Layer stack $L_1$ for forming the peripheral transistor comprises, in sequence, a gate oxide layer 2 on the upper surface of substrate 1, an electrically conductive polysilicon gate electrode layer 3 ("poly 2") on gate oxide layer 2, a barrier material layer 4 of titanium nitride (TiN) or tungsten nitride ($WN_x$) on polysilicon layer 3, a tungsten gate electrode contact layer 5 on barrier material layer 4, and silicon nitride layer 6 on tungsten contact layer 5. Layer stack $L_2$ for forming a memory cell comprises, in addition to the above described layers 2–6, a further electrically conductive polysilicon gate electrode layer 7 ("poly 1") formed on gate oxide layer 2 and an interpoly dielectric layer 8, typically a silicon oxide/silicon nitride/silicon oxide ("ONO") composite, formed on polysilicon layer 7 and below polysilicon layer 3 ("poly 2").

Layers 2–8 typically are formed utilizing well-known oxidative, reactive, physical vapor, and/or chemical vapor deposition techniques, the details of which are omitted from the description for brevity, except as noted. A preferred method for forming barrier material layer 4 comprises reactive sputtering of a titanium or tungsten target in a nitrogen ($N_2$) containing atmosphere. The use of a tungsten target has an advantage in that the same target can be used, in sequence, for formation of the overlying tungsten contact layer 5 by non-reactive sputtering. Tungsten contact layer 5 can also be formed by a chemical vapor deposition process (CVD) utilizing e.g., tungsten hexafluoride ($WF_6$). Suitable ranges of thickness as well as preferred thicknesses for each of the layers of the layer stacks are indicated in Table 1 below.

TABLE 1

| Layer | Material | Thickness Range, Å | Preferred Thickness, Å |
|---|---|---|---|
| 2 | Silicon oxide | 25–150 | 70 |
| 3 | Polysilicon | 900–2500 | 1200 |
| 4 | Titanium nitride or tungsten nitride | 50–300 | 100 |
| 5 | Tungsten | 700–4000 | 2000 |
| 6 | Silicon nitride | 150–1000 | 700 |
| 7 | Polysilicon | 250–1000 | 500 |
| 8 | Silicon oxide/ silicon nitride silicon oxide | 50–300 | 150 |

After forming layer stacks $L_1$ and $L_2$, a bottom anti-reflection coating layer 9 ("BARC") is formed atop the uppermost, silicon nitride layer 6 of each layer stack, followed by formation thereon a patterned photoresist layer 10, in a known manner. Then layers 4–6, respectively formed of titanium nitride or tungsten nitride, tungsten, and silicon nitride, are etched along with BARC layer 9, as by reactive ion etching (RIE), using patterned photoresist layer 10 as an etch mask and polysilicon layer 3 (poly 2) as an etch stop. After removal of the photoresist layer 10 along with the underlying portion of BARC layer 9, the structures shown in FIGS. 1(b) and 2(b) are obtained.

Next, a second silicon nitride film, at least about 1,000 Å thick, is deposited over the thus-patterned layer stacks so as to cover all exposed surfaces thereof and anisotropically etched, as by reactive ion etching, to remove a major portion of the thickness of the second silicon nitride film formed on the upper surface of the first silicon nitride film 6, while leaving "spacer" portions 11 of the second silicon nitride covering the sidewall surfaces of the layer stacks, as shown in FIGS. 1(c) and 2(c). Spacer portions 11 are typically tapered in width from their lower ends proximate polysilicon layer 3 to essentially no width at their upper ends proximate silicon nitride "capping" layer 6. Suitable widths for the lower end portions of the tapered spacer portions 11 are from about 500 Å to about 2500 Å.

The combination of silicon nitride "capping" layer 6 and sidewall spacer portions 11 serves to effectively encapsulate tungsten gate electrode contact layer 5 and prevent deleterious oxidation thereof during subsequent high temperature treatments performed in an oxidizing ambient, e.g., furnace annealing in an oxygen containing atmosphere at a temperature of from about 800° C. to about 950° C. for from about 30 min. to about 60 min. As may be evident, the widths and densities (alternatively, porosities) of both silicon nitride layers are selected in accordance with the subsequent processing conditions to effectively preclude entry of oxidants (e.g., $O_2$) thereinto for reaction with tungsten contact layer 5. In addition to the above consideration, the as-deposited thickness of the silicon nitride capping layer 6 should be sufficiently thick to withstand further etching during subsequent processing steps.

Next, polysilicon layer 3 is etched away, as by reactive ion etching, using silicon nitride capping layer 6 as a self-aligned hard mask. The resulting structures are as shown in FIGS. 1(d) and 2(d). For the flash memory cell, since the silicon oxide and silicon nitride layers of composite interpoly dielectric layer 8 act as an etch stop, another dry (e.g., a reactive ion) etch is performed to remove the exposed portions of the ONO composite dielectric layer 8 and polysilicon layer 7 (poly 1), again using silicon nitride capping layer 6 as a self-aligned mask. Etch selectivity during this process is high against silicon nitride and therefore, the silicon nitride "capping" layer 6 retains sufficient thickness to prevent oxidation of the tungsten contact layer 5 during any subsequent high temperature annealing processing, as may be seen from FIG. 2(e). A further technological advantage attendant the inventive process wherein silicon nitride "capping" layer 6 remains over the tungsten contact layer throughout processing is the ability to perform a high selectivity etch to remove the field oxide in a later step. Again, the combination of silicon "capping" layer 6 and sidewall spacer layer portions 11 effectively prevents oxidation of the tungsten contact layer 5 during any high temperature processing associated therewith.

Referring now to FIGS. 1(e) and 2(e), a series of light and medium dosage ion implantation steps are next performed to form active regions of differing dopant density and profile in the semiconductor substrate 1, such as, but not limited to, source and drain regions 12 and 13. In addition, a high temperature furnace annealing step at a temperature of from about 800° C. to about 1000° C., e.g., preferably about 900° C., is performed for from about 15 min. to about 60 min., preferably about 30 min., between successive implantations of differing dosage in order to form a pre-low dosage implant layer at a thickness of about 75 Å. As indicated above, tungsten electrode contact layer 5 is effectively prevented from oxidation during this step by virtue of the silicon nitride encapsulating layers 6 and 11.

Following the dopant implantation steps for forming active regions, such as source and drain regions 12 and 13, and with reference to FIGS. 1(*f*) and 2(*f*), oxide spacer layer 14 is formed to a thickness of from about 500 Å to about 2000 Å, preferably about 1000 Å, on the exposed surfaces of the layer stacks $L_1$ and $L_2$, as well as on the exposed surface of the substrate 1. In the case of the memory cell, the oxide layer 14 is selectively etched as shown in FIG. 2(*f*), using the silicon nitride capping layer 6 as an etch stop.

Referring now to FIGS. 1(*g*) and 2(*g*), an additional layer of oxide is then deposited on the side surfaces of oxide layer 14, resulting in the formation of thicker sidewall spacer layers 15, and oxide on the upper surface of the layer stack is removed by selective etching. In a further step, shown in FIGS. 1(*h*) and 2(*h*), source/drain $N^+$ regions 16 and Vss connections are formed by ion implantation, in conventional manner.

Thus, by providing silicon nitride layers according to the present invention which effectively encapsulate the tungsten gate electrode contact and remain in place essentially throughout all processing steps involving high temperature treatment in oxidizing ambients, the problem of deleterious oxidation of the tungsten contacts is eliminated and sub-micron sized contacts having extremely low sheet resistance are, therefore, reliably obtained. Moreover, although in the illustrated embodiment, the inventive concept is applied to the manufacture of flash EEPROMS, the inventive method and structure of the present invention are applicable to all manner of semiconductor devices employing tungsten or tungsten-based contacts.

In the previous descriptions, numerous specific details are set forth, such as particular materials, structures, reactants, processes, etc., in order to provide a thorough understanding of the present invention. However, it should be recognized that the present invention can be practiced without resorting to the details specifically set forth. In other instances, well-known processing structures and techniques have not been described in detail in order not to unnecessarily obscure the present invention.

Only the preferred embodiments of the present invention are shown and described herein. It is to be understood that the present invention is capable of changes or modifications within the scope of the inventive concept as expressed herein.

What is claimed is:

1. A method of manufacturing a semiconductor device, which method comprises the steps of:

providing a semiconductor substrate comprising silicon and having a surface;

sequentially forming over said substrate surface a layer stack comprising:

a gate oxide layer (a) on said substrate surface, an electrically conductive polysilicon layer (b) on said gate oxide layer, a barrier material layer (c) on said polysilicon layer, a tungsten layer (d) on said barrier material layer, and a silicon nitride layer (e) on said tungsten layer;

selectively removing portions of layers (c)–(e) to define a pattern therein exposing sidewall surfaces of said layers (c)–(e);

selectively forming a silicon nitride layer (f) covering said exposed sidewall surfaces of said layers (c)–(e), whereby said tungsten layer (d) is encapsulated by the combination of said silicon nitride layers (e) and (f) formed on the uppermost and sidewall surfaces thereof, respectively;

selectively removing portions of polysilicon layer (b) to define a pattern therein exposing sidewall surfaces thereof in substantial vertical registry with said sidewall surfaces of layers (c)–(e); and annealing the thus-formed layer stack at an elevated temperature in an oxidizing ambient, whereby said silicon nitride encapsulating layers (e) and (f) prevent oxidation of said tungsten layer (d) during said annealing.

2. The method as in claim 1, wherein said semiconductor device comprises a transistor, said electrically conductive polysilicon layer (b) comprises a gate electrode of said transistor, said tungsten layer (d) comprises a gate electrode contact, and the method comprises forming said layer stack on at least a peripheral portion of said substrate surface.

3. The method as in claim 2, further comprising:

forming said layer stack on a central portion of said substrate surface; and, after forming gate oxide layer (a) but prior to forming polysilicon layer (b):

forming an electrically conductive polysilicon layer (a') on said gate oxide layer (a); and forming an interpoly dielectric layer (a") on said polysilicon layer (a');

the method further comprising the step of selectively removing portions of polysilicon layer (a') and interpoly dielectric layer (a") to thereby expose sidewall surfaces thereof in substantial vertical registry with said exposed sidewall surfaces of layers (b)–(e); wherein said semiconductor device comprises a flash-type EEPROM, said polysilicon layer (a') comprises a floating gate electrode, said polysilicon layer (b) comprises a low sheet resistance control gate electrode, and said tungsten layer (d) comprises a control gate electrode contact.

4. The method as in claim 3, comprising annealing by heating in an oxygen containing ambient at a temperature of from about 800° C. to about 950° C. for from about 30 min. to about 60 min.

5. The method as in claim 3, comprising forming said gate oxide layer (a) at a thickness of from about 25 Å to about 150 Å.

6. The method as in claim 3, comprising forming said polysilicon layer (a') at a thickness of from about 250 Å to about 1000 Å.

7. The method as in claim 3, comprising forming said interpoly dielectric layer (a") at a thickness of from about 50 Å to about 300 Å.

8. The method as in claim 7, wherein said interpoly dielectric layer (a") comprises a silicon oxide/silicon nitride/silicon oxide composite.

9. The method as in claim 3, comprising forming said polysilicon layer (b) at a thickness of from about 900 Å to about 2500 Å.

10. The method as in claim 3, comprising forming said layer (c) of barrier material at a thickness of from about 50 Å to about 300 Å.

11. The method as in claim 10, comprising depositing said layer (c) of barrier material comprising tungsten nitride by reactive sputtering of a tungsten target in a nitrogen-containing atmosphere.

12. The method as in claim 10, comprising depositing said layer (c) of barrier material comprising titanium nitride deposited by reactive sputtering of a titanium target in a nitrogen-containing atmosphere.

13. The method as in claim 3, comprising forming said layer (d) of tungsten at a thickness of from about 700 Å to about 4000 Å by a physical or chemical vapor deposition process.

14. The method as in claim 3, comprising forming said layer (e) of silicon nitride on the upper surface of tungsten layer (d) at a thickness of from about 150 Å to about 1,000 Å.

15. The method as in claim 3, comprising forming said layer (f) of silicon nitride on said sidewall surfaces of layers (c)–(e) at a width of from about 500 Å to about 2500 Å at its lower end proximate the substrate surface and tapering to essentially no width at its upper, distal end.

16. The method as in claim 3, further comprising forming source and drain regions at selected locations of the substrate surface.

17. The method as in claim 16, further comprising forming at least one layer of oxide covering at least the sidewall surfaces of said layer stack and said silicon nitride layer (f).

\* \* \* \* \*